US012748144B2

(12) United States Patent
Watanabe

(10) Patent No.: US 12,748,144 B2
(45) Date of Patent: Sep. 29, 2026

(54) TESTING APPARATUS FOR HIGH-RATE TRANSMISSION AND RECEPTION OF SIGNALS BETWEEN DEVICE UNDER TEST AND SEMICONDUCTOR TESTING APPARATUS

(71) Applicant: ADVANTEST CORPORATION, Tokyo (JP)

(72) Inventor: Daisuke Watanabe, Saitama (JP)

(73) Assignee: ADVANTEST CORPORATION, Tokyo (JP)

(*) Notice: Subject to any disclaimer, the term of this patent is extended or adjusted under 35 U.S.C. 154(b) by 167 days.

(21) Appl. No.: 18/770,898

(22) Filed: Jul. 12, 2024

(65) Prior Publication Data

US 2025/0085335 A1 Mar. 13, 2025

(30) Foreign Application Priority Data

Sep. 13, 2023 (JP) ................................ 2023-148730

(51) Int. Cl.
*G01R 31/28* (2006.01)
*G01R 1/04* (2006.01)
(Continued)

(52) U.S. Cl.
CPC ....... *G01R 31/2841* (2013.01); *G01R 1/0416* (2013.01); *G01R 31/2889* (2013.01);
(Continued)

(58) Field of Classification Search
CPC ............ G01R 31/2841; G01R 31/2889; G01R 31/308; G01R 31/3025; G01R 1/0416;
(Continued)

(56) References Cited

U.S. PATENT DOCUMENTS

2004/0059971 A1* 3/2004 Cowan .............. G01R 31/2834 714/724
2008/0059091 A1 3/2008 Watanabe et al.
(Continued)

FOREIGN PATENT DOCUMENTS

JP 2008-116420 A 5/2008
JP 2009-128358 A 6/2009
(Continued)

OTHER PUBLICATIONS

KR 20090054448 Machine Translation, May 29, 2009 (Year: 2009).*
(Continued)

*Primary Examiner* — Raul J Rios Russo
(74) *Attorney, Agent, or Firm* — Greenblum & Bernstein, P.L.C.

(57) ABSTRACT

A testing apparatus includes a driver and a test signal providing section. The driver is connected electrically to a device under test and arranged to provide a test signal to the device under test. The test signal providing section is arranged to provide the test signal to the driver. The driver is closer than the test signal providing section to the device under test. A bandwidth of communication between the driver and the test signal providing section is broader than a bandwidth of communication between the driver and the device under test.

26 Claims, 11 Drawing Sheets

(51) Int. Cl.

| | |
|---|---|
| ***G01R 31/302*** | (2006.01) |
| ***G01R 31/308*** | (2006.01) |
| ***G01R 31/3181*** | (2006.01) |
| ***G01R 31/3183*** | (2006.01) |
| ***H04B 10/80*** | (2013.01) |
| ***H04L 41/0896*** | (2022.01) |

(52) U.S. Cl.
CPC ....... *G01R 31/3025* (2013.01); *G01R 31/308* (2013.01); *G01R 31/31813* (2013.01); *G01R 31/318314* (2013.01); *H04B 10/80* (2013.01); *H04L 41/0896* (2013.01)

(58) Field of Classification Search
CPC ...... G01R 31/318314; G01R 31/31813; H04L 41/0896; H04B 10/80
USPC ...................................................... 324/754.23
See application file for complete search history.

(56) References Cited

U.S. PATENT DOCUMENTS

| | | | | |
|---|---|---|---|---|
| 2008/0218178 | A1* | 9/2008 | Watanabe .......... | G01R 31/2889 324/612 |
| 2009/0015288 | A1* | 1/2009 | Teng ................ | G01R 31/31924 324/750.3 |
| 2009/0102496 | A1* | 4/2009 | Wu .................... | G01R 31/2886 324/754.07 |
| 2009/0136235 | A1 | 5/2009 | Suh et al. | |
| 2010/0049453 | A1 | 2/2010 | Watanabe et al. | |
| 2010/0052736 | A1 | 3/2010 | Watanabe et al. | |
| 2010/0176835 | A1 | 7/2010 | Sasajima | |
| 2014/0024315 | A1* | 1/2014 | Olgaard ................. | H04B 17/00 455/67.11 |
| 2017/0176494 | A1* | 6/2017 | Hiew ................. | G01R 31/2886 |

FOREIGN PATENT DOCUMENTS

| | | |
|---|---|---|
| JP | 2010-181251 A | 8/2010 |
| KR | 10-2009-0054448 | 5/2009 |
| KR | 10-2010-0039400 | 4/2010 |
| KR | 10-2013-0042225 | 4/2013 |

OTHER PUBLICATIONS

Office Action dated Jul. 16, 2025 and issued in Korean patent application No. 10-2024-0090929 along with an English translation.

* cited by examiner

TESTING APPARATUS FOR HIGH-RATE TRANSMISSION AND RECEPTION OF SIGNALS BETWEEN DEVICE UNDER TEST AND SEMICONDUCTOR TESTING APPARATUS

BACKGROUND OF THE INVENTION

Field of the Invention

The present invention relates to transmitting and receiving signals between a device under test and a semiconductor testing apparatus.

Description of the Related Art

A device under test and a semiconductor testing apparatus are connected through a transmission path for transmitting electrical signals. In a particular case where high-rate signals are transmitted and received between the device under test and the semiconductor testing apparatus, the transmission path needs to be designed to have a broader transmission bandwidth.

It is noted that there have been known techniques for optical transmission between a semiconductor testing apparatus and a device under test (see Japanese Patent Application Publication Nos. 2010-181251, 2009-128358, and 2008-116420, for example).

SUMMARY OF THE INVENTION

However, in such conventional techniques as described above, electrical signal transmission through, for example, a transmission line on a printed circuit board, a connector, and a cable is utilized in the high-rate signal connecting path between the device under test and the semiconductor testing apparatus. In general, due to the mechanical structure of the semiconductor testing apparatus, the transmission path often has a physical length of several tens of centimeters to one meter or more and thereby has a limited bandwidth, which makes it difficult to transmit and receive high-rate signals.

It is hence an object of the present invention to achieve high-rate transmission and reception of signals between a device under test and a semiconductor testing apparatus.

According to a first aspect of the present invention, a testing apparatus includes: a driver connected electrically to a device under test and arranged to provide a test signal to the device under test; and a test signal providing section arranged to provide the test signal to the driver, wherein the driver is closer than the test signal providing section to the device under test, and a bandwidth of communication between the driver and the test signal providing section is broader than a bandwidth of communication between the driver and the device under test.

According to the thus constructed testing apparatus, a driver is connected electrically to a device under test and arranged to provide a test signal to the device under test. A test signal providing section is arranged to provide the test signal to the driver. The driver is closer than the test signal providing section to the device under test. A bandwidth of communication between the driver and the test signal providing section is broader than a bandwidth of communication between the driver and the device under test.

According to the first aspect of the present invention, the driver and the test signal providing section may employ optical transmission therebetween.

According to the first aspect of the present invention, the driver and the test signal providing section may be connected through an optical transmission path.

According to the first aspect of the present invention, the driver and the test signal providing section may employ wireless transmission therebetween.

According to the first aspect of the present invention, the testing apparatus may further include a switch arranged to switch whether the device under test and the driver are connected, wherein the switch is closer than the test signal providing section to the device under test.

According to the first aspect of the present invention, the switch may connect the device under test and a direct-current measuring unit arranged to conduct a direct-current test on the device under test.

According to the first aspect of the present invention, the testing apparatus may further include a receiver arranged to receive an output signal from the device under test and provide an output based on the output signal, wherein the driver may be closer than the receiver to the device under test, and a bandwidth of communication between the receiver and the device under test may be broader than the bandwidth of communication between the driver and the device under test.

According to the first aspect of the present invention, the device under test and the driver may be on a same substrate.

According to the first aspect of the present invention, the device under test and the driver may be, respectively, on separate substrates.

According to the first aspect of the present invention, the substrate on which is the device under test may be at a position higher than that of the substrate on which is the driver.

According to a second aspect of the present invention, a testing apparatus includes: a receiver connected electrically to a device under test and arranged to receive an output signal from the device under test and provide an output based on the output signal; and a signal under test receiving section arranged to receive the output from the receiver, wherein the receiver is closer than the signal under test receiving section to the device under test, and a bandwidth of communication between the receiver and the signal under test receiving section is broader than a bandwidth of communication between the receiver and the device under test.

According to the thus constructed testing apparatus, a receiver is connected electrically to a device under test and arranged to receive an output signal from the device under test and provide an output based on the output signal. A signal under test receiving section is arranged to receive the output from the receiver. The receiver is closer than the signal under test receiving section to the device under test. A bandwidth of communication between the receiver and the signal under test receiving section is broader than a bandwidth of communication between the receiver and the device under test.

According to the second aspect of the present invention, the receiver and the signal under test receiving section may employ optical transmission therebetween.

According to the second aspect of the present invention, the receiver and the signal under test receiving section may be connected through an optical transmission path.

According to the second aspect of the present invention, the receiver and the signal under test receiving section may employ wireless transmission therebetween.

According to the second aspect of the present invention, the testing apparatus may further include a switch arranged to switch whether the device under test and the receiver are connected, wherein the switch may be closer than the signal under test receiving section to the device under test.

According to the second aspect of the present invention, the switch may connect the device under test and a direct-current measuring unit arranged to conduct a direct-current test on the device under test.

According to the second aspect of the present invention, the testing apparatus may further include a driver arranged to provide a test signal to the device under test, wherein the receiver may be closer than the driver to the device under test, and a bandwidth of communication between the driver and the device under test may be broader than the bandwidth of communication between the receiver and the device under test.

According to the second aspect of the present invention, the device under test and the receiver may be on a same substrate.

According to the second aspect of the present invention, the device under test and the receiver may be, respectively, on separate substrates.

According to the second aspect of the present invention, the substrate on which is the device under test may be at a position higher than that of the substrate on which is the receiver.

According to a third aspect of the present invention, a testing apparatus includes: a driver connected electrically to a device under test and arranged to provide a test signal to the device under test; a receiver connected electrically to the device under test and arranged to receive an output signal from the device under test and provide an output based on the output signal; a test signal providing section arranged to provide the test signal to the driver; and a signal under test receiving section arranged to receive the output from the receiver, wherein the driver is closer than the test signal providing section to the device under test, the receiver is closer than the signal under test receiving section to the device under test, a bandwidth of communication between the driver and the test signal providing section is broader than a bandwidth of communication between the driver and the device under test, and a bandwidth of communication between the receiver and the signal under test receiving section is broader than a bandwidth of communication between the receiver and the device under test.

According to the thus constructed testing apparatus, a driver is connected electrically to a device under test and arranged to provide a test signal to the device under test. A receiver is connected electrically to the device under test and arranged to receive an output signal from the device under test and provide an output based on the output signal. A test signal providing section is arranged to provide the test signal to the driver. A signal under test receiving section is arranged to receive the output from the receiver. The driver is closer than the test signal providing section to the device under test. The receiver is closer than the signal under test receiving section to the device under test. A bandwidth of communication between the driver and the test signal providing section is broader than a bandwidth of communication between the driver and the device under test. A bandwidth of communication between the receiver and the signal under test receiving section is broader than a bandwidth of communication between the receiver and the device under test.

According to the third aspect of the present invention, the testing apparatus may further include a switch that connects the driver or the receiver to the device under test. According to the third aspect of the present invention, the test signal providing section may have: a pattern generator arranged to generate a pattern of the test signal; and a timing generator arranged to generate output timing for the test signal.

According to the third aspect of the present invention, the signal under test receiving section may have: an expectation pattern generating section arranged to generate an expectation pattern; an expectation comparison timing generating section arranged to output a timing signal that provides timing for comparison of the expectation pattern; and an expectation comparing section arranged to compare an output signal from the receiver and the expectation pattern.

DESCRIPTION OF THE PREFERRED EMBODIMENT

A preferred embodiment of the present invention will hereinafter be described with reference to the accompanying drawings.

Figure 1:
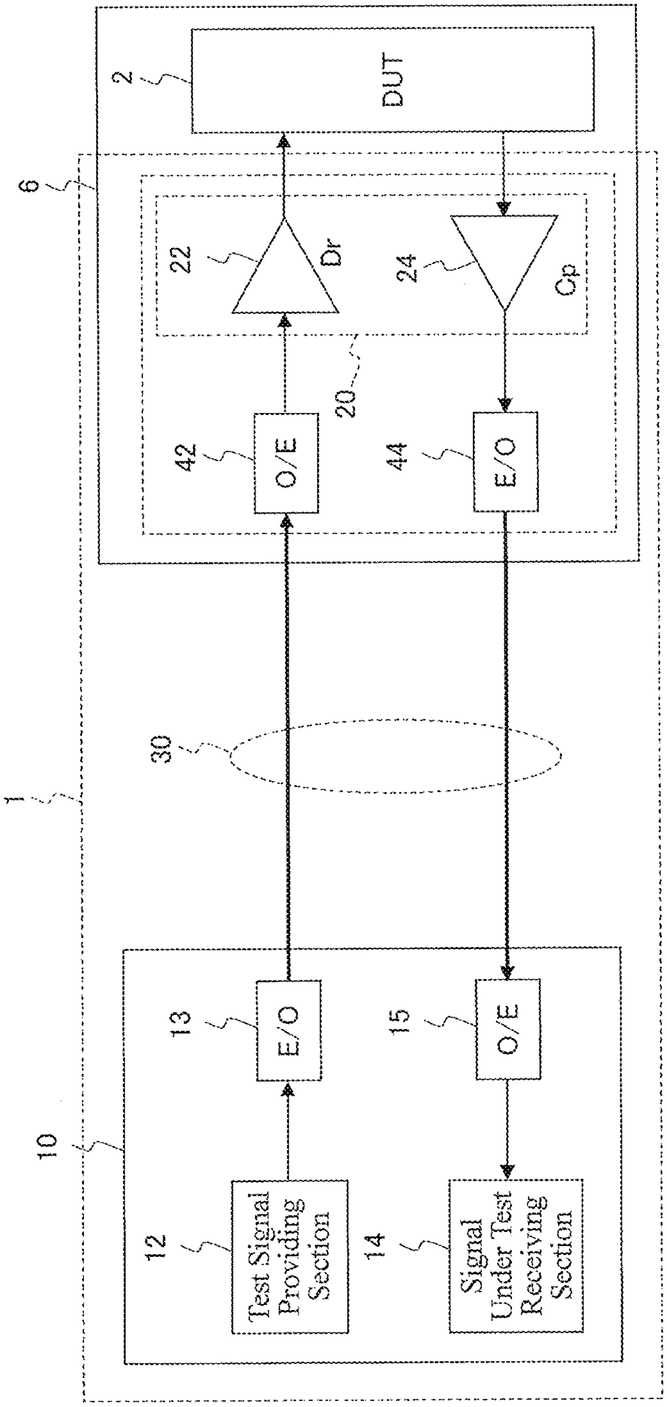
FIG. 1 is a functional block diagram showing a configuration of a testing apparatus 1 according to an embodiment of the present invention.

FIG. 1 is a functional block diagram showing the configuration of a testing apparatus 1 according to an embodiment of the present invention. The testing apparatus 1 according to the embodiment of the present invention includes a test head 10, a driver 22, a comparator 24, an optical transmission path 30, an O/E conversion element 42, and an E/O conversion element 44.

The testing apparatus 1 is connected to a device under test (DUT) 2. It is noted that the test head 10 has a test signal providing section 12, a signal under test receiving section 14, an E/O conversion element 13, and an O/E conversion element 15. Also, the device under test 2, the driver (Dr) 22, the comparator (Cp) 24, the O/E conversion element 42, and the E/O conversion element 44 are on a socket board 6. Further, the driver 22 and the comparator 24 are referred to collectively as a pin electronics 20. It is noted that the driver 22, the comparator 24, the O/E conversion element 42, and the E/O conversion element 44 are preferably implemented as a SiP (System in Package), but may be implemented as a SoC (System on Chip) using an Si photonics process.

The driver 22 is connected electrically to the device under test 2 and arranged to provide a test signal to the device under test 2. The comparator 24 is connected electrically to the device under test 2 and arranged to receive an output signal from the device under test 2 (i.e. a signal output from the device under test 2 to the semiconductor testing apparatus) and compare it with a predetermined threshold value. The driver 22 may also provide, as a test signal, a binary signal of 0 or 1 or a trinary or higher signal of 0, 1, 2, . . . . The comparator 24 is arranged to receive the output signal as a binary signal of 0 or 1 or a trinary or higher signal of 0, 1, 2, . . . and compare it with a predetermined multilevel threshold value.

The test signal providing section 12 is arranged to provide a test signal through the E/O conversion element 13, the optical transmission path 30, and the O/E conversion element 42 to the driver 22. That is, a test signal (an electrical signal) output from the test signal providing section 12 is converted through the E/O conversion element 13 into an optical signal. The output from the E/O conversion element 13 is then provided through the optical transmission path 30 to the O/E conversion element 42. The optical test signal is then converted through the O/E conversion element 42 into an electrical signal and provided to the driver 22.

The signal under test receiving section 14 is arranged to receive an output from the comparator 24 through the E/O conversion element 44, the optical transmission path 30, and the O/E conversion element 15. That is, an output (an electrical signal) from the comparator 24 is converted through the E/O conversion element 44 into an optical signal. The output from the E/O conversion element 44 is then provided through the optical transmission path 30 to the O/E conversion element 15. The optical output signal from the comparator 24 is then converted through the O/E conversion element 15 into an electrical signal and provided to the signal under test receiving section 14.

The driver 22 is closer than the test signal providing section 12 to the device under test 2. The comparator 24 is closer than the signal under test receiving section 14 to the device under test 2.

As an example, the distance between the device under test 2 and the pin electronics 20 is about 1 cm and the optical transmission path 30 employs, for example, an optical fiber with a length of about 1 m or more, though the distance and the length should not be limited to the numerical values above.

The bandwidth of communication between the driver 22 and the test signal providing section 12 is broader than the bandwidth of communication between the driver 22 and the device under test 2. That is, the driver 22 and the test signal providing section 12 are connected through the optical transmission path 30 via the E/O conversion element 13 and the O/E conversion element 42. The driver 22 and the test signal providing section 12 employ optical transmission therebetween through the optical transmission path 30 via the E/O conversion element 13 and the O/E conversion element 42. The bandwidth of this optical transmission through the optical transmission path 30 is the bandwidth of communication between the driver 22 and the test signal providing section 12 and is broader than the bandwidth of communication (through electrical connection) between the driver 22 and the device under test 2. It is noted that since the test signal providing section 12 and the E/O conversion element 13 are in close proximity to each other and the driver 22 and the O/E conversion element 42 are also in close proximity to each other, the presence of the E/O conversion element 13 and the O/E conversion element 42 cannot limit the bandwidth of communication between the driver 22 and the test signal providing section 12.

It is noted that the driver 22 and the test signal providing section 12 may employ wireless communication therebetween. In this case, the E/O conversion element 13, the O/E conversion element 42, and the optical transmission path 30 are not required. However, this is on the assumption that the bandwidth of communication between the driver 22 and the test signal providing section 12 is broader than the bandwidth of communication between the driver 22 and the device under test 2.

The bandwidth of communication between the comparator 24 and the signal under test receiving section 14 is broader than the bandwidth of communication between the comparator 24 and the device under test 2. That is, the comparator 24 and the signal under test receiving section 14 are connected through the optical transmission path 30 via the E/O conversion element 44 and the O/E conversion element 15. The comparator 24 and the signal under test receiving section 14 employ optical transmission therebetween through the optical transmission path 30 via the E/O conversion element 44 and the O/E conversion element 15. The bandwidth of this optical transmission through the optical transmission path 30 is the bandwidth of communication between the comparator 24 and the signal under test receiving section 14 and is broader than the bandwidth of communication (through electrical connection) between the comparator 24 and the device under test 2. It is noted that since the signal under test receiving section 14 and the O/E conversion element 15 are in close proximity to each other and the comparator 24 and the E/O conversion element 44 are also in close proximity to each other, the presence of the E/O conversion element 44 and the O/E conversion element 15 cannot limit the bandwidth of communication between the comparator 24 and the signal undertest receiving section 14.

It is noted that the comparator 24 and the signal under test receiving section 14 may employ wireless communication therebetween. In this case, the E/O conversion element 44, the O/E conversion element 15, and the optical transmission path 30 are not required. However, this is on the assumption that the bandwidth of communication between the comparator 24 and the signal under test receiving section 14 is broader than the bandwidth of communication between the comparator 24 and the device under test 2.

Figure 4:
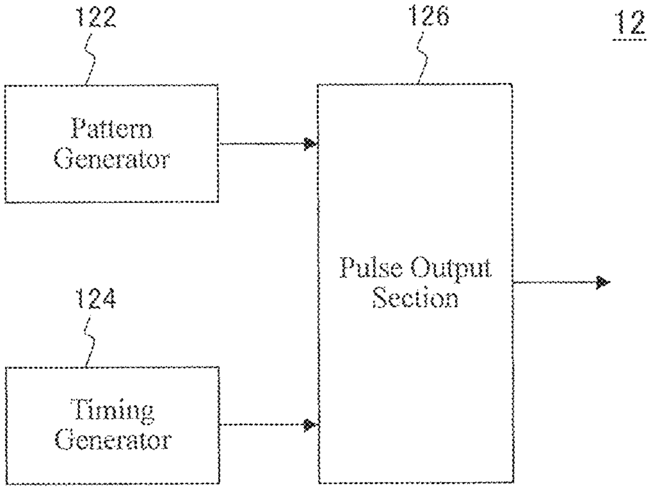
FIG. 4 is a functional block diagram showing a configuration of a test signal providing section 12.

FIG. 4 is a functional block diagram showing the configuration of the test signal providing section 12. The test signal providing section 12 has a pattern generator 122, a timing generator 124, and a pulse output section 126.

The pattern generator 122 is arranged to generate a pattern of the test signal. The pattern of the test signal is, for example, a series of binary data values of 0 or 1 such as 01001 . . . (or may be a series of trinary or higher data values).

The timing generator 124 is arranged to generate output timing for the test signal (e.g. output start time and period of the test signal).

The pulse output section 126 is arranged to output a pulse as a test signal according to outputs from the pattern generator 122 and the timing generator 124.

Figure 9:
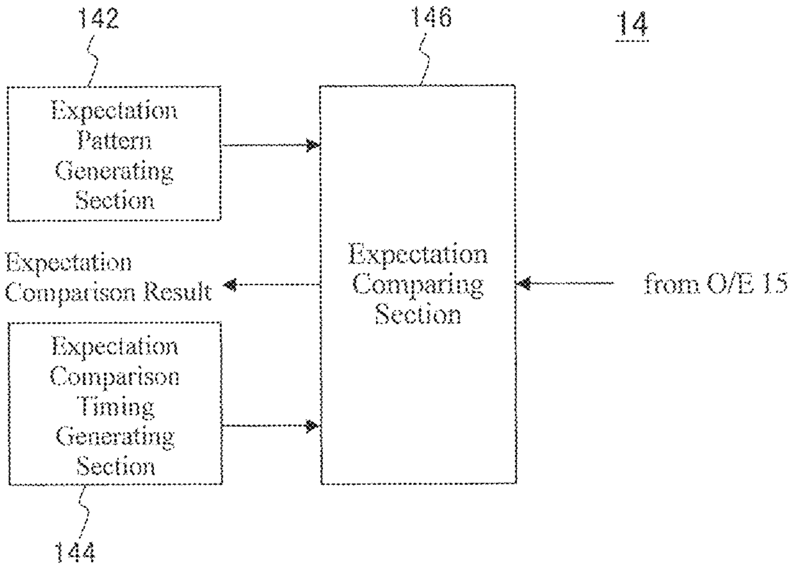
FIG. 9 is a functional block diagram showing a configuration of a signal under test receiving section 14.

FIG. 9 is a functional block diagram showing the configuration of the signal under test receiving section 14. The signal under test receiving section 14 has an expectation pattern generating section 142, an expectation comparison timing generating section 144, and an expectation comparing section 146.

The expectation pattern generating section 142 is arranged to generate an expectation pattern to be used in the expectation comparing section 146.

The expectation comparison timing generating section 144 is arranged to output a timing signal that provides timing for comparison of the expectation pattern. The expectation comparison timing generating section 144 is further arranged to latch an output signal from the comparator 24 that is provided through the E/O conversion element 44, the optical transmission path 30, and the O/E conversion element 15 to the signal under test receiving section 14.

The expectation comparing section 146 is arranged to compare, with the expectation pattern, a logical value of the output signal from the comparator 24 that is provided through the E/O conversion element 44, the optical transmission path 30, and the O/E conversion element 15 to the signal under test receiving section 14, and then output a comparison result.

It is often the case that the device under test 2 is intentionally placed in an environment of high temperature and low temperature during a test. For this reason, the test signal providing section 12 and the signal under test receiving section 14 (in particular, the timing generator 124), when placed near the device under test 2, may be affected by the high temperature and low temperature and may fail to maintain a desired accuracy.

In addition, since the test signal providing section 12 and the signal under test receiving section 14 have a large circuit size and high power, it is difficult to allow space for placing near the device under test 2 due to the structure for power supply and cooling.

Next will be described an operation according to the embodiment of the present invention.

First, a test signal (an electrical signal) output from the test signal providing section 12 is converted through the E/O conversion element 13 into an optical signal. The output from the E/O conversion element 13 is then provided through the optical transmission path 30, which has a broader communication bandwidth, to the O/E conversion element 42. The optical test signal is then converted through the O/E conversion element 42 into an electrical signal and provided to the driver 22.

The test signal is then provided from the driver 22 to the device under test 2. On the other hand, a signal under test is output from the device under test 2 and provided to the comparator 24. The comparator 24 receives the signal under test once, and then outputs the signal under test to a signal under test receiving section for logical determination. The comparator 24 compares it with a predetermined threshold value (a level threshold value) and outputs a logical result according to the comparison result.

The output (an electrical signal) from the comparator 24 is converted through the E/O conversion element 44 into an optical signal. The output from the E/O conversion element 44 is then provided through the optical transmission path 30, which has a broader communication bandwidth, to the O/E conversion element 15. The optical output signal from the comparator 24 is then converted through the O/E conversion element 15 into an electrical signal and provided to the signal under test receiving section 14.

The signal under test receiving section 14 receives the output from the comparator 24 and compares it with a pattern of the test signal to conduct a test (e.g. a function test) on the device under test 2.

In accordance with the testing apparatus 1 according to the embodiment of the present invention, it is possible to achieve high-rate transmission and reception of signals between the device under test 2 and the testing apparatus 1.

That is, since the pin electronics 20 is in proximity to the device under test 2, it is possible to achieve high-rate transmission and reception of signals between the pin electronics 20 and the device under test 2.

However, as described above, it is difficult to place the test signal providing section 12 and the signal under test receiving section 14 near the device under test 2, having no choice but to place them away from the device under test 2. To address this, the test signal providing section 12 and the signal under test receiving section 14 are connected through the optical transmission path 30, which has a broader communication bandwidth, to the pin electronics 20 for optical transmission, which allows for high-rate signal transmission and reception.

It is noted that since the pin electronics 20 is in proximity to the device under test 2, the power used for waveform equalization to compensate for the transmission path distortion of high-rate electrical signals can be reduced considerably, resulting in a reduction in the power for the entire testing apparatus 1.

In addition, since the use of the optical transmission path 30 allows for reduction in the transmission distance for electrical transmission (transmission of signals between the pin electronics 20 and the device under test 2), it is possible to suppress inter-symbol interference due to waveform distortion that is generated in the electrical transmission path.

It is noted that the comparator 24 may be replaced with a component (e.g. a circuit for comparative operation using a differential amplifier, an operational amplifier, a logic gate, a photocoupler, or a relay) (hereinafter referred to as "comparison circuit") that compares the output signal from the device under test 2 with a predetermined threshold value.

Alternatively, the comparator 24 may be replaced with a repeater arranged to receive, linearly amplify, and repeat a signal. Note here that an output from such a repeater is compared with a predetermined threshold value before provision to the expectation comparing section 146, and then the comparison result is provided to the expectation comparing section 146.

Further, the comparator 24, and the comparison circuit and the repeater used in place thereof can each be considered a receiver that receives an output signal from the device under test 2 and provides an output based on the output signal.

It is noted that the embodiment of the present invention can have the following variations.

First Variation

The first variation is an example corresponding to a case where a response signal output from the device under test 2 is an optical signal.

Figure 2:
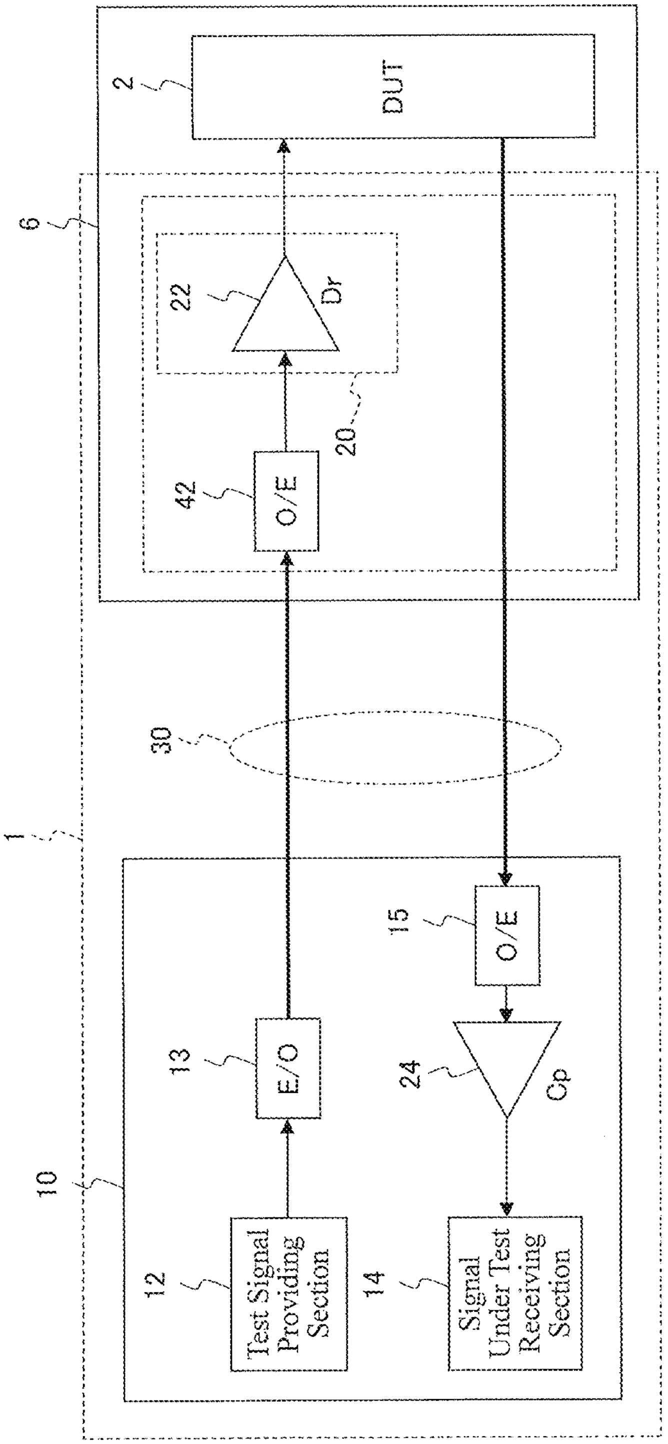
FIG. 2 is a functional block diagram showing a configuration of a testing apparatus 1 according to a first variation of the embodiment of the present invention.

FIG. 2 is a functional block diagram showing the configuration of a testing apparatus 1 according to the first variation of the embodiment of the present invention.

The comparator 24 is located within the test head 10. This causes the driver 22 to be closer than the comparator 24 to the device under test 2. It is noted that the comparator 24 is arranged to receive an output from the O/E conversion element 15 and the signal under test receiving section 14 is arranged to be provided with an output from the comparator 24.

Also, the bandwidth of communication between the comparator 24 and the device under test 2 is broader than the bandwidth of communication between the driver 22 and the device under test 2. That is, the comparator 24 and the device under test 2 are connected through the optical transmission path 30. The bandwidth of this optical transmission through the optical transmission path 30 is the bandwidth of communication between the comparator 24 and the device under test 2 and is broader than the bandwidth of communication (through electrical connection) between the driver 22 and the device under test 2.

Second Variation

The second variation is an example corresponding to a case where a test signal provided to the device under test 2 is an optical signal.

Figure 3:
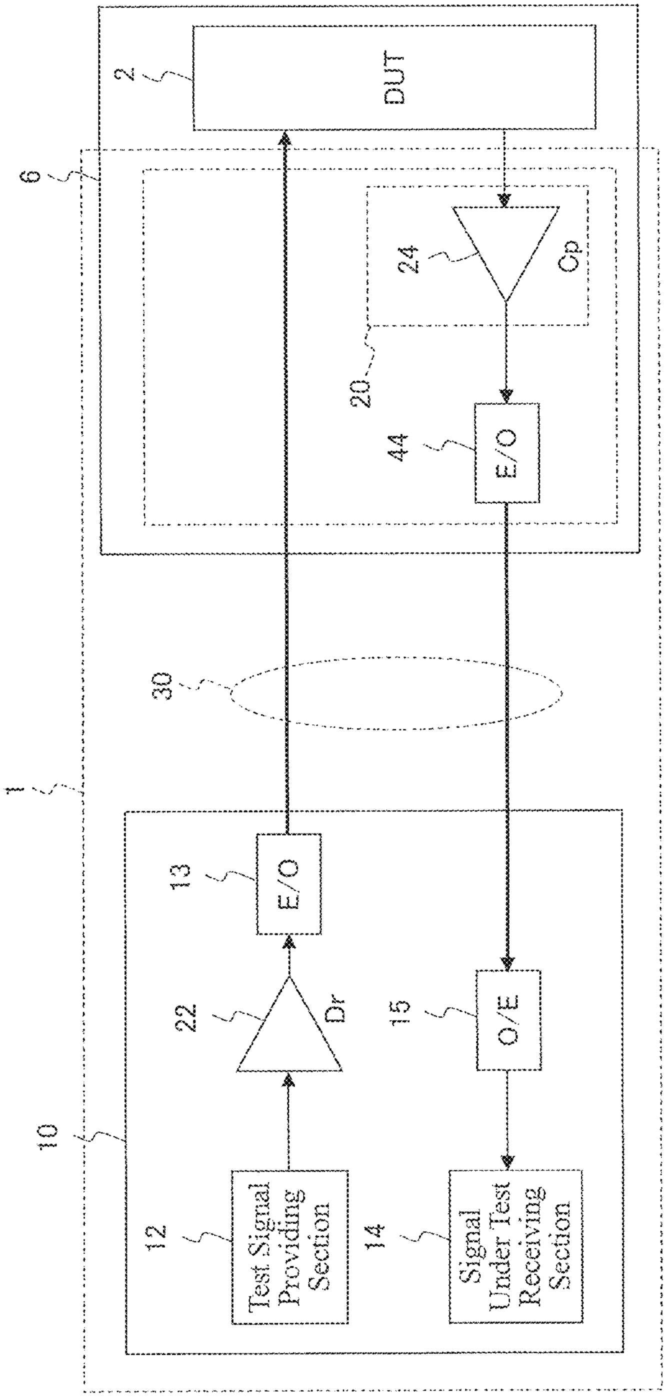
FIG. 3 is a functional block diagram showing a configuration of a testing apparatus 1 according to a second variation of the embodiment of the present invention.

FIG. 3 is a functional block diagram showing the configuration of a testing apparatus 1 according to the second variation of the embodiment of the present invention.

The driver 22 is located within the test head 10. This causes the comparator 24 to be closer than the driver 22 to the device under test 2. It is noted that the driver 22 is arranged to receive an output from the test signal providing section 12 and the E/O conversion element 13 is arranged to be provided with an output from the driver 22.

Also, the bandwidth of communication between the driver 22 and the device under test 2 is broader than the bandwidth of communication between the comparator 24 and the device under test 2. That is, the driver 22 and the device under test 2 are connected through the optical transmission path 30. The bandwidth of this optical transmission through the optical transmission path 30 is the bandwidth of communication between the driver 22 and the device under test 2 and is broader than the bandwidth of communication (through electrical connection) between the comparator 24 and the device under test 2.

Third Variation

The third variation provides a configuration in which the pin electronics 20 has both a driver function and a comparator function, and the connection between the pin electronics 20 and the device under test 2 is shared for input and output.

Figure 10:
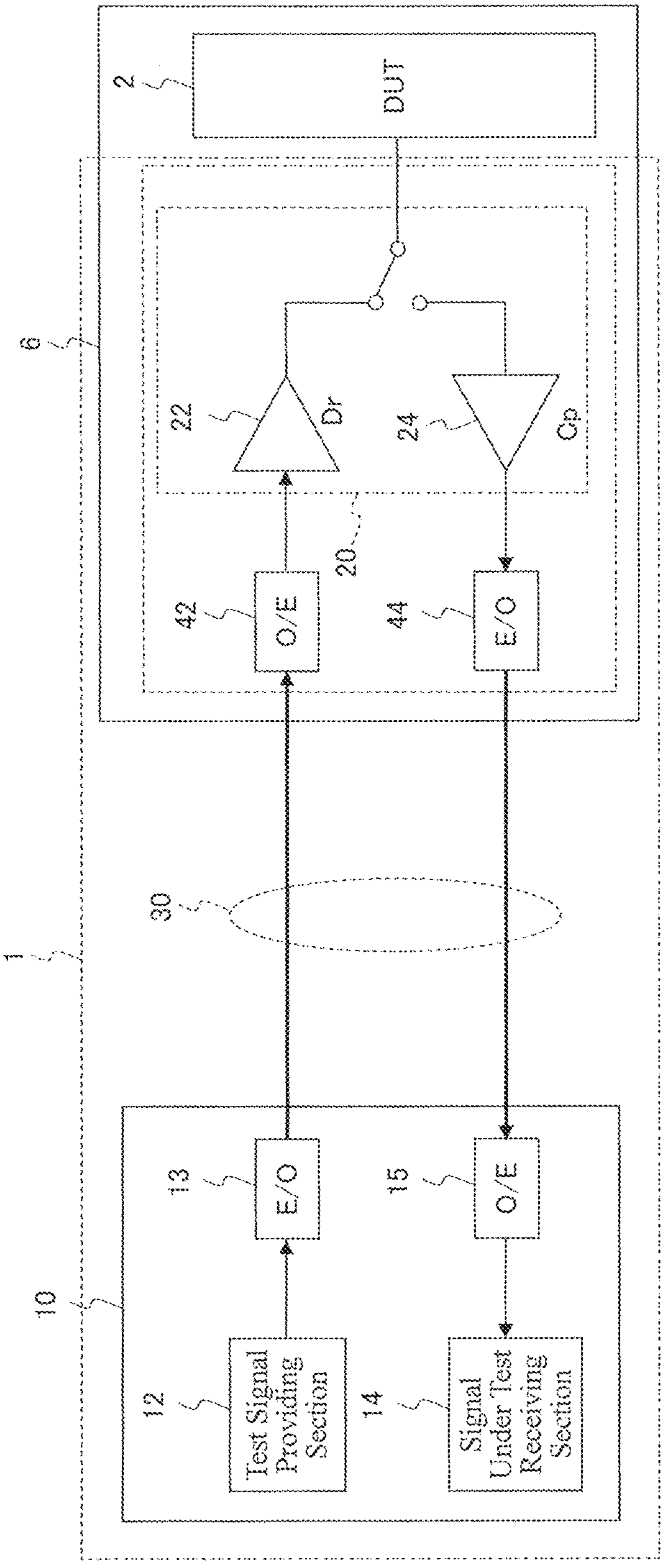
FIG. 10 is a functional block diagram showing a configuration of a testing apparatus 1 (where a driver 22 and a device under test 2 are connected) according to a third variation of the embodiment of the present invention.
Figure 11:
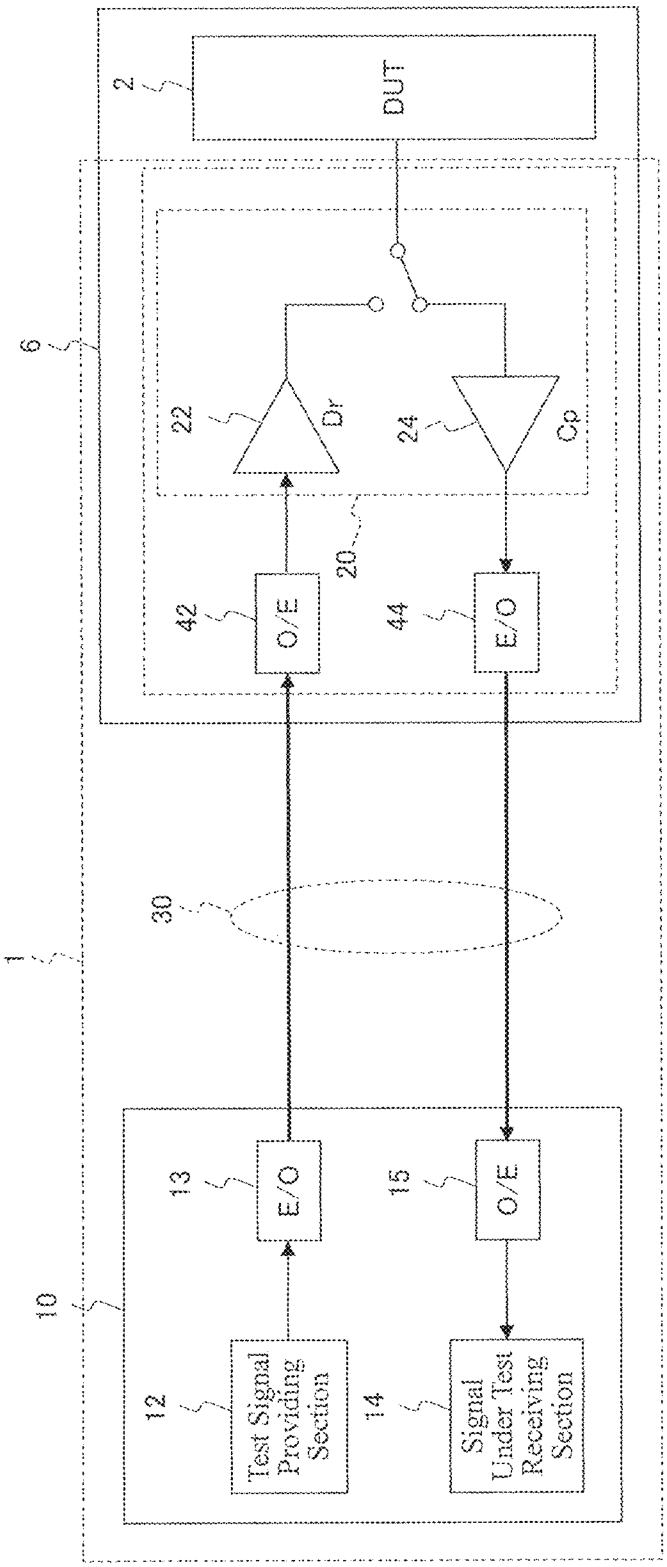
FIG. 11 is a functional block diagram showing a configuration of a testing apparatus 1 (where a comparator 24 and the device under test 2 are connected) according to the third variation of the embodiment of the present invention.

FIG. 10 is a functional block diagram showing the configuration of a testing apparatus 1 (where a driver 22 and a device under test 2 are connected) according to the third variation of the embodiment of the present invention. FIG. 11 is a functional block diagram showing the configuration of a testing apparatus 1 (where a comparator 24 and a device under test 2 are connected) according to the third variation of the embodiment of the present invention.

The pin electronics 20 further has a switch arranged to switch whether the driver 22 is connected to the device under test 2 (e.g. an input/output pin of the device under test 2) (see FIG. 10) or the comparator 24 is connected to the device under test 2 (e.g. an input/output pin of the device under test 2) (see FIG. 11).

Fourth Variation

The fourth variation provides a configuration in which the testing apparatus 1 further includes a switch 50.

Figure 7:
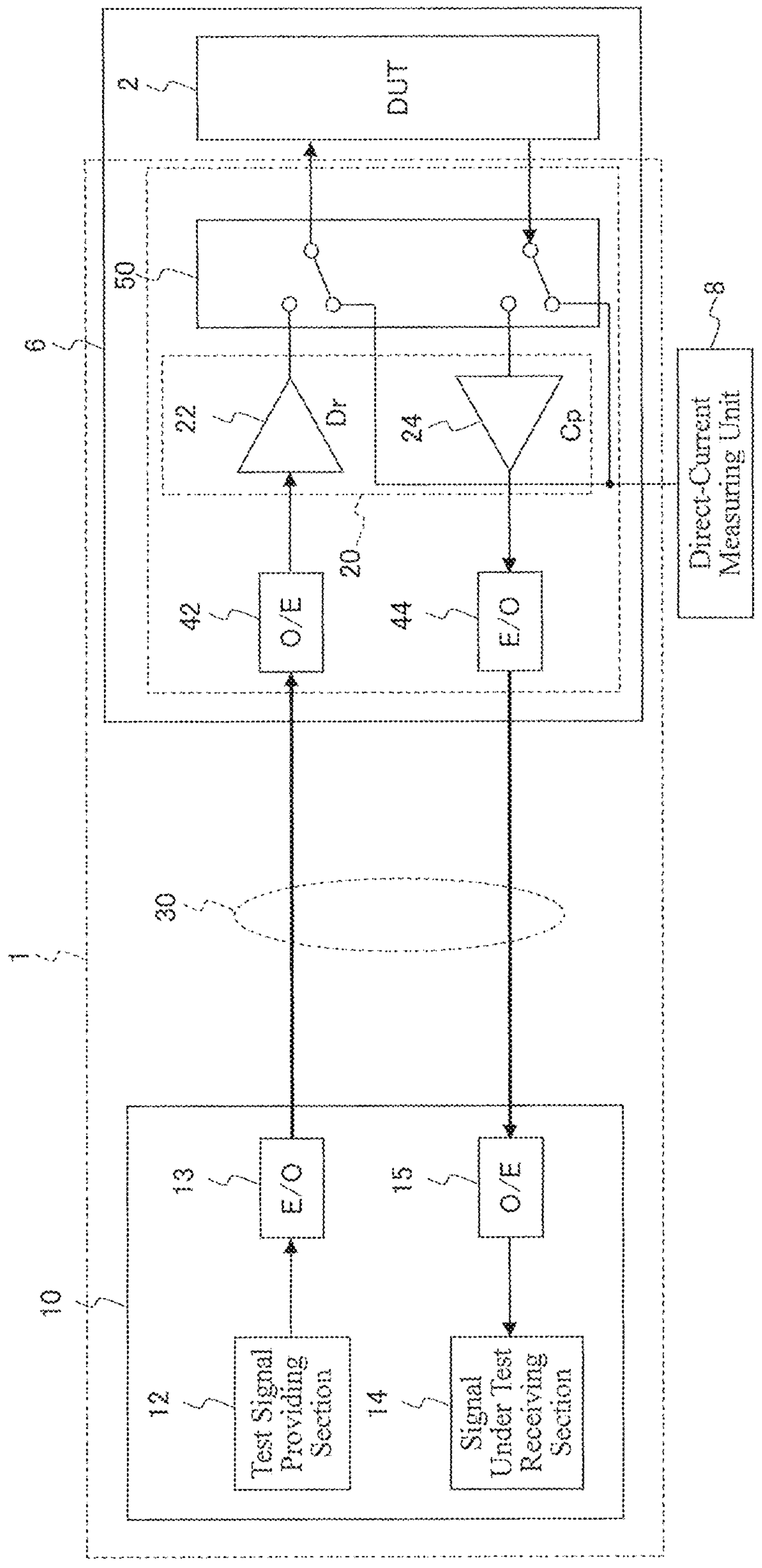
FIG. 7 is a functional block diagram showing a configuration of a testing apparatus 1 (where a direct-current measuring unit 8 and a device under test 2 are connected) according to a fourth variation of the embodiment of the present invention.
Figure 8:
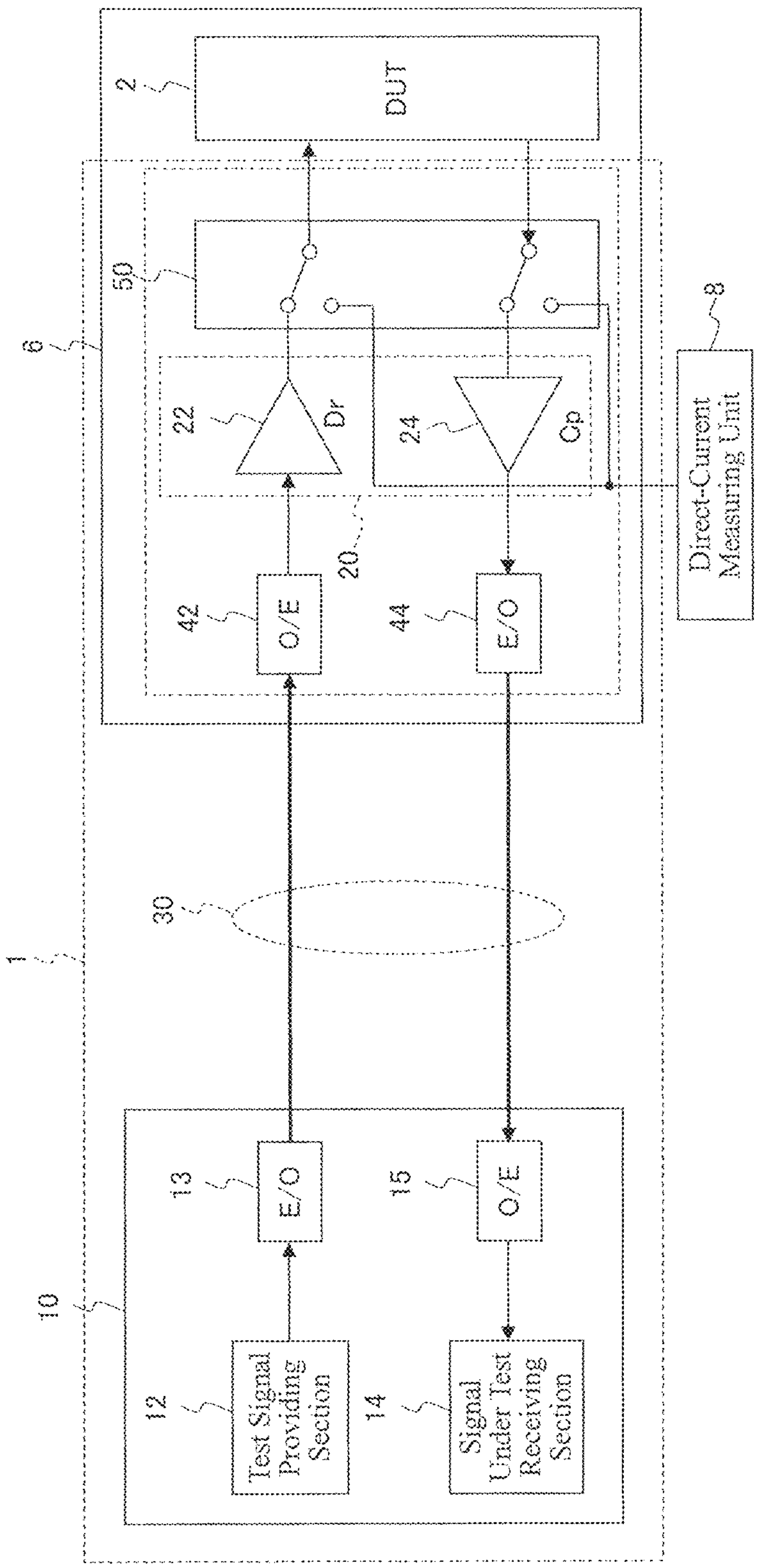
FIG. 8 is a functional block diagram showing a configuration of a testing apparatus 1 (where a driver 22 and a comparator 24 are connected with the device under test 2) according to the fourth variation of the embodiment of the present invention.

FIG. 7 is a functional block diagram showing the configuration of a testing apparatus 1 (where a direct-current measuring unit 8 and a device under test 2 are connected) according to the fourth variation of the embodiment of the present invention. FIG. 8 is a functional block diagram showing the configuration of a testing apparatus 1 (where a driver 22 and a comparator 24 are connected with a device under test 2) according to the fourth variation of the embodiment of the present invention.

The switch 50 is arranged to switch whether the direct-current measuring unit 8 is connected with the device under test 2 (see FIG. 7) or the driver 22 and the comparator 24 are connected with the device under test 2 (see FIG. 8). Note here that the direct-current measuring unit 8 is a direct-current testing circuit.

Fifth Variation

The fifth variation provides a configuration in which the testing apparatus 1 further includes a satellite board 7.

Figure 5:
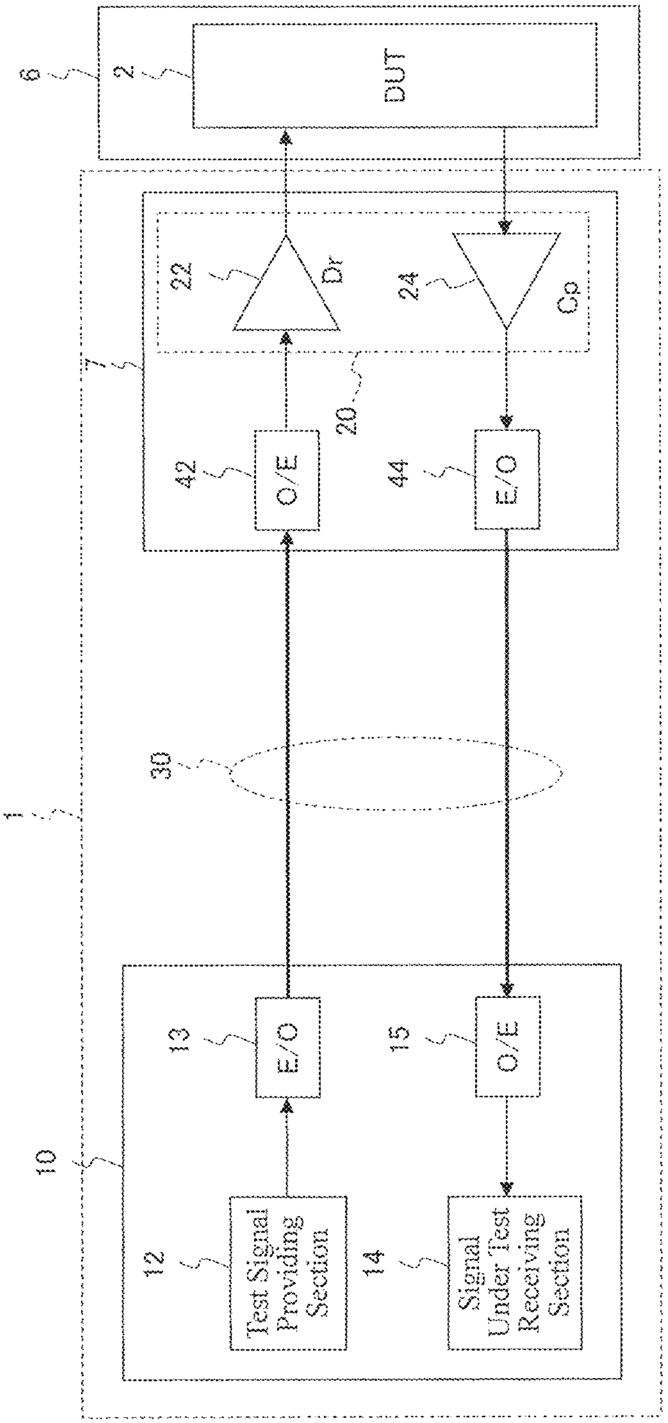
FIG. 5 is a functional block diagram showing a configuration of a testing apparatus 1 according to a fifth variation of the embodiment of the present invention.

FIG. 5 is a functional block diagram showing the configuration of a testing apparatus 1 according to the fifth variation of the embodiment of the present invention. In the testing apparatus 1 according to the fifth variation, a driver 22, a comparator 24, an O/E conversion element 42, and an E/O conversion element 44 are implemented on the satellite board 7, which is different from the socket board 6. The satellite board 7 is connected with the socket board 6 at an extremely short distance. Thus, in the fifth variation, the satellite board 7 on which are the driver 22 and the comparator 24 is different from the socket board 6 on which is the device under test 2. This is different from the embodiment of the present invention in which the driver 22 and the comparator 24 as well as the device under test 2 are placed on the same socket board 6.

Figure 6:
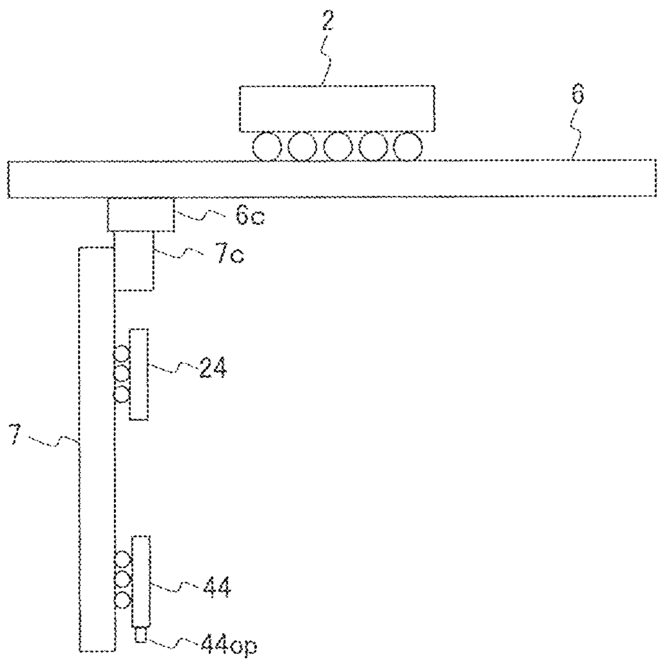
FIG. 6 shows an example of how a socket board 6 and a satellite board 7 are connected in the testing apparatus 1 according to the fifth variation of the embodiment of the present invention.

FIG. 6 shows an example of how the socket board 6 and the satellite board 7 are connected in the testing apparatus 1 according to the fifth variation of the embodiment of the present invention. A connector 6*c* of the socket board 6 and a connector 7*c* of the satellite board 7 are connected directly. It is noted that the satellite board 7 is at a position lower than that of the socket board 6. Also, the E/O conversion element 44 has an optical transmission connector 44*op* (to be connected to the optical transmission path 30). Thus, in the fifth variation, the socket board 6 on which is the device under test 2 is at a position higher than that of the satellite board 7 on which are the driver 22 and the comparator 24.

DESCRIPTION OF REFERENCE NUMERALS

1 Testing Apparatus
2 Device Under Test (DUT)
6 Socket Board
10 Test Head
12 Test Signal Providing Section
13 E/O Conversion Element
14 Signal Under Test Receiving Section
15 O/E Conversion Element
20 Pin Electronics

22 Driver (Dr)
24 Comparator (Cp)
30 Optical Transmission Path
42 O/E Conversion Element
44 E/O Conversion Element
50 Switch

What is claimed is:

1. A testing apparatus, comprising:
a driver connected electrically to a device under test and arranged to provide a test signal to the device under test; and
a test signal providing section arranged to provide the test signal to the driver, wherein
the driver is closer than the test signal providing section to the device under test, and
a bandwidth of communication between the driver and the test signal providing section is broader than a bandwidth of communication between the driver and the device under test.

2. The testing apparatus according to claim 1, wherein
the driver and the test signal providing section employ optical transmission therebetween.

3. The testing apparatus according to claim 2, wherein
the driver and the test signal providing section are connected through an optical transmission path.

4. The testing apparatus according to claim 1, wherein
the driver and the test signal providing section employ wireless transmission therebetween.

5. The testing apparatus according to claim 1, further comprising a switch arranged to switch whether the device under test and the driver are connected, wherein
the switch is closer than the test signal providing section to the device under test.

6. The testing apparatus according to claim 5, wherein
the switch connects the device under test and a direct-current measuring unit arranged to conduct a direct-current test on the device under test.

7. The testing apparatus according to claim 1, further comprising a receiver arranged to receive an output signal from the device under test and provide an output based on the output signal, wherein
the driver is closer than the receiver to the device under test, and
a bandwidth of communication between the receiver and the device under test is broader than the bandwidth of communication between the driver and the device under test.

8. The testing apparatus according to claim 1, wherein
the device under test and the driver are on a same substrate.

9. The testing apparatus according to claim 1, wherein
the device under test and the driver are, respectively, on separate substrates.

10. The testing apparatus according to claim 9, wherein
the substrate on which is the device under test is at a position higher than that of the substrate on which is the driver.

11. The testing apparatus according to claim 1, wherein
the test signal providing section has:
a pattern generator arranged to generate a pattern of the test signal; and
a timing generator arranged to generate output timing for the test signal.

12. A testing apparatus, comprising:
a receiver connected electrically to a device under test and arranged to receive an output signal from the device under test and provide an output based on the output signal; and
a signal under test receiving section arranged to receive the output from the receiver, wherein
the receiver is closer than the signal under test receiving section to the device under test, and
a bandwidth of communication between the receiver and the signal under test receiving section is broader than a bandwidth of communication between the receiver and the device under test.

13. The testing apparatus according to claim 12, wherein
the receiver and the signal under test receiving section employ optical transmission therebetween.

14. The testing apparatus according to claim 13, wherein
the receiver and the signal under test receiving section are connected through an optical transmission path.

15. The testing apparatus according to claim 12, wherein
the receiver and the signal under test receiving section employ wireless transmission therebetween.

16. The testing apparatus according to claim 12, further comprising a switch arranged to switch whether the device under test and the receiver are connected, wherein
the switch is closer than the signal under test receiving section to the device under test.

17. The testing apparatus according to claim 16, wherein
the switch connects the device under test and a direct-current measuring unit arranged to conduct a direct-current test on the device under test.

18. The testing apparatus according to claim 12, further comprising a driver arranged to provide a test signal to the device under test, wherein
the receiver is closer than the driver to the device under test, and
a bandwidth of communication between the driver and the device under test is broader than the bandwidth of communication between the receiver and the device under test.

19. The testing apparatus according to claim 12, wherein
the device under test and the receiver are on a same substrate.

20. The testing apparatus according to claim 12, wherein
the device under test and the receiver are, respectively, on separate substrates.

21. The testing apparatus according to claim 20, wherein
the substrate on which is the device under test is at a position higher than that of the substrate on which is the receiver.

22. The testing apparatus according to claim 12, wherein
the signal under test receiving section has:
an expectation pattern generating section arranged to generate an expectation pattern;
an expectation comparison timing generating section arranged to output a timing signal that provides timing for comparison of the expectation pattern; and
an expectation comparing section arranged to compare an output signal from the receiver and the expectation pattern.

23. A testing apparatus, comprising:
a driver connected electrically to a device under test and arranged to provide a test signal to the device under test;

a receiver connected electrically to the device under test and arranged to receive an output signal from the device under test and provide an output based on the output signal;

a test signal providing section arranged to provide the test signal to the driver; and a signal under test receiving section arranged to receive the output from the receiver, wherein the driver is closer than the test signal providing section to the device under test, the receiver is closer than the signal under test receiving section to the device under test, a bandwidth of communication between the driver and the test signal providing section is broader than a bandwidth of communication between the driver and the device under test, and a bandwidth of communication between the receiver and the signal under test receiving section is broader than a bandwidth of communication between the receiver and the device under test.

24. The testing apparatus according to claim 23, further comprising a switch that connects the driver or the receiver to the device under test.

25. The testing apparatus according to claim 23, wherein the test signal providing section has:

a pattern generator arranged to generate a pattern of the test signal; and a timing generator arranged to generate output timing for the test signal.

26. The testing apparatus according to claim 23, wherein the signal under test receiving section has:

an expectation pattern generating section arranged to generate an expectation pattern;

an expectation comparison timing generating section arranged to output a timing signal that provides timing for comparison of the expectation pattern; and an expectation comparing section arranged to compare an output signal from the receiver and the expectation pattern.

* * * * *